(12) United States Patent
Chou et al.

(10) Patent No.: US 11,527,606 B2
(45) Date of Patent: Dec. 13, 2022

(54) SEMICONDUCTOR DEVICE AND METHOD FOR FORMING THE SAME

(71) Applicant: Vanguard International Semiconductor Corporation, Hsinchu (TW)

(72) Inventors: Yu-Chieh Chou, New Taipei (TW); Tsung-Hsiang Lin, New Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 17/003,555

(22) Filed: Aug. 26, 2020

(65) Prior Publication Data
US 2021/0320196 A1 Oct. 14, 2021

(30) Foreign Application Priority Data
Apr. 13, 2020 (TW) ................... 109112294

(51) Int. Cl.
| | | |
|---|---|---|
| *H01L 29/778* | (2006.01) | |
| *H01L 29/267* | (2006.01) | |
| *H01L 29/06* | (2006.01) | |
| *H01L 29/66* | (2006.01) | |
| *H01L 29/40* | (2006.01) | |

(52) U.S. Cl.
CPC ........ *H01L 29/0619* (2013.01); *H01L 29/267* (2013.01); *H01L 29/408* (2013.01); *H01L 29/66431* (2013.01); *H01L 29/66462* (2013.01); *H01L 29/7786* (2013.01)

(58) Field of Classification Search
CPC ..... H01L 29/267; H01L 29/7782–7787; H01L 29/0611; H01L 29/0615; H01L 29/0619; H01L 29/0626; H01L 29/778–7789; H01L 29/66431; H01L 29/66462; H01L 2924/13064
See application file for complete search history.

(56) References Cited

U.S. PATENT DOCUMENTS

| | | | |
|---|---|---|---|
| 6,498,360 B1 * | 12/2002 | Jain .............................. | 257/192 |
| 10,714,607 B1 * | 7/2020 | Chiang ................. | H01L 29/207 |
| 2015/0263155 A1 * | 9/2015 | Fujimoto ............ | H01L 29/7786 |
| | | | 257/76 |

(Continued)

FOREIGN PATENT DOCUMENTS

| | | | |
|---|---|---|---|
| CN | 105405878 A | * | 3/2016 |
| EP | 0493797 A2 | * | 7/1992 |

(Continued)

*Primary Examiner* — Yu Chen
(74) *Attorney, Agent, or Firm* — Birch, Stewart, Kolasch & Birch, LLP

(57) ABSTRACT

A semiconductor device is provided. The semiconductor device includes a substrate; a buffer layer on the substrate; a channel layer on the buffer layer; a barrier layer on the channel layer; a doped compound semiconductor layer on a portion of the barrier layer; an un-doped first capping layer on the doped compound semiconductor layer; a gate structure on the un-doped first capping layer; and source/drain structures on opposite sides of the gate structure. There is a channel region in the channel layer that is adjacent to the interface between the channel layer and the barrier layer.

15 Claims, 4 Drawing Sheets

(56) References Cited

U.S. PATENT DOCUMENTS

| | | | | |
|---|---|---|---|---|
| 2016/0056245 | A1* | 2/2016 | Kinoshita | H01L 29/8086 438/191 |
| 2016/0268409 | A1* | 9/2016 | Ogawa | H01L 29/7787 |
| 2018/0308968 | A1* | 10/2018 | Miura | H01L 29/41758 |
| 2019/0334022 | A1* | 10/2019 | Buckley | H01L 29/207 |

FOREIGN PATENT DOCUMENTS

| | | |
|---|---|---|
| TW | 201842678 A | 12/2018 |
| TW | 202010130 A | 3/2020 |

\* cited by examiner

SEMICONDUCTOR DEVICE AND METHOD FOR FORMING THE SAME

CROSS REFERENCE TO RELATED APPLICATIONS

This application claims priority of Taiwan Patent Application No. 109112294 filed on Apr. 13, 2020, the entirety of which is incorporated by reference herein.

BACKGROUND

Technical Field

The present disclosure relates to a semiconductor device and a method for forming the same, and particularly relates to a high electron mobility transistor and a method for forming the same.

Description of the Related Art

A high electron mobility transistor (HEMT), also referred to as hetero-structure field-effect transistor (HFET) or modulation-doped field-effect transistor (MODFET), is a type of field-effect transistor (FET) formed of semiconductor materials with different energy gaps. There is a two-dimensional electron gas (2DEG) present at the interface between adjacent semiconductor materials. As a result of the high mobility of 2DEG, HEMT has several advantages, such as a high breakdown voltage, a high electron mobility rate, low on-state resistance, low input capacitance, and so on. This makes it suitable for use in high-power devices.

An enhancement mode (E-mode) HEMT is in a cut-off state when the gate voltage is not applied. Conventionally, a p-type III-V semiconductor is used as a band adjustment layer electrically connecting the gate. As demand for ultra-high voltage applications increase, a HEMT that provides a higher threshold voltage is required. However, a HEMT should be highly stable and reliable before system testing.

While existing HEMTs generally meet the requirements, they are not satisfactory in all respects. In particular, device uniformity and the hysteresis effect of the HEMT still need to be improved.

BRIEF SUMMARY OF THE DISCLOSURE

The present disclosure provides a semiconductor device. The semiconductor device includes a substrate, a buffer layer, a channel layer, a barrier layer, a doped compound semiconductor layer, an un-doped first capping layer, a gate structure, and source/drain structures. The buffer layer is on the substrate. The channel layer is on the buffer layer. The barrier layer is on the channel layer. There is a channel region in the channel layer that is adjacent to the interface between the channel layer and the barrier layer. The doped compound semiconductor layer is disposed on a portion of the barrier layer. The un-doped first capping layer is disposed on the doped compound semiconductor layer. The gate structure is disposed on the un-doped first capping layer. The source/drain structures are disposed on opposite sides of the gate structure.

The present disclosure also provides a method for forming a semiconductor device. The method includes forming a buffer layer on a substrate; forming a channel layer on the buffer layer; forming a barrier layer on the channel layer, wherein there is a channel region in the channel layer that is adjacent to the interface between the channel layer and the barrier layer; forming a stack of layers on a portion of the barrier layer sequentially including, from bottom to top, a doped compound semiconductor layer, an un-doped first capping layer, and a gate structure; and forming source/drain structures on opposite sides of the gate structure.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION OF THE DISCLOSURE

Figure 1:
FIGS. 1-9 are cross-sectional views of various stages in the formation of a semiconductor device in accordance with some embodiments of the disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath", "below", "lower", "over", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about", "approximately" and "substantially" typically mean +/−20% of the stated value, more typically +/−10% of the stated value and even more typically +/−5% of the stated value, more typically +/−3% of the stated value, more typically +/−2% of the stated value, more typically +/−1% of the stated value and even more typically +/−0.5% of the stated value. It should be noted that the stated value of the disclosure is an approximate value. When there is no specific description, the stated value includes the meaning of "about", "approximately" or "substantially".

Although some embodiments are discussed with operations performed in a particular order, these operations may be performed in another logical order. Additional features can be provided to the semiconductor structures in embodiments of the present disclosure. Some of the features described below can be replaced or eliminated for different embodiments.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

The embodiments of the present disclosure provide a semiconductor device. By inserting an un-doped capping layer between the gate structure and the underlying doped compound semiconductor layer, the doped compound semiconductor layer may be protected from damage due to the high temperature and the high energy of the subsequent processes. Device uniformity and hysteresis of the semiconductor device may be improved by protecting the doped compound semiconductor layer with a capping layer so that the semiconductor device can provide higher saturation current (Isat) and have higher breakdown voltage.

FIGS. 1-9 and 10A are cross-sectional views of various stages in the formation of a semiconductor device in accordance with some embodiments of the disclosure. Referring to FIG. 1, a substrate 100 is provided. In some embodiments, the substrate 100 may be a bulk semiconductor substrate, or the like, that may be doped (e.g., with a p-type or an n-type dopant) or un-doped. Other substrates, such as a multi-layered substrate or a gradient substrate, may also be used. In some embodiments, the semiconductor material of the semiconductor substrate may include an element semiconductor material, such as silicon or germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP, or combinations thereof. In other embodiments, the substrate 100 may also be a glass substrate, a silicon-on-insulator (SOI) substrate, or a ceramic substrate. The ceramic substrate may be, for example, a SiC substrate, an AlN substrate, or a sapphire substrate. In an embodiment, the ceramic substrate may cover an insulator layer.

In one embodiment, a seed layer (not shown) and a buffer layer (not shown) are optionally formed on the substrate 100. The seed layer is on the substrate 100, and the buffer layer is on the seed layer. The seed layer may alleviate the lattice mismatch between the substrate 100 and the layers grown on the substrate 100, thereby increasing the quality of crystallization. The seed layer is optional. In other embodiments, the semiconductor device may not have the seed layer. In some embodiments, the material of the seed layer may be or include AlN, AlGaN, other suitable material, or combinations thereof.

Figure 2:
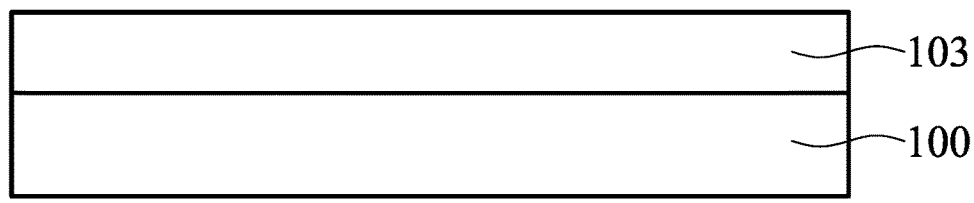

Referring to FIG. 2, the buffer layer 103 is formed on the substrate 100. The buffer layer 103 may alleviate the strain of the channel layer 102 that is subsequently formed on the buffer layer to prevent traps formed in the above channel layer 102. In some embodiments, as stated above, the seed layer may not disposed in the semiconductor device. Instead, the buffer layer 103 may be formed directly on the substrate 100 to simplify the process flow. In some embodiments, the material of the buffer layer 103 may include a III-V compound semiconductor, such as group-III nitride. For example, the material of the buffer layer 103 may be or include GaN, AlN, AlGaN, AlInN, other suitable materials, or combinations thereof.

Next, still referring to FIG. 2, a channel layer 102 is formed on the buffer layer 103. In some embodiments, the channel layer 102 may include a III-V semiconductor, such as GaN. In other embodiments, the channel layer 102 may also include AlGaN, AlN, GaAs, GaInP, AlGaAs, InP, InAlAs, InGaAs, other suitable III-V semiconductor materials, or combinations thereof. The thickness of the channel layer 102 may range from about 1,000 nm to about 10,000 nm. The channel layer 102 may be formed using molecular beam epitaxy (MBE), metalorganic chemical vapor deposition (MOCVD), hydride vapor phase epitaxy (HVPE), other suitable methods, or combinations thereof.

Figure 3:
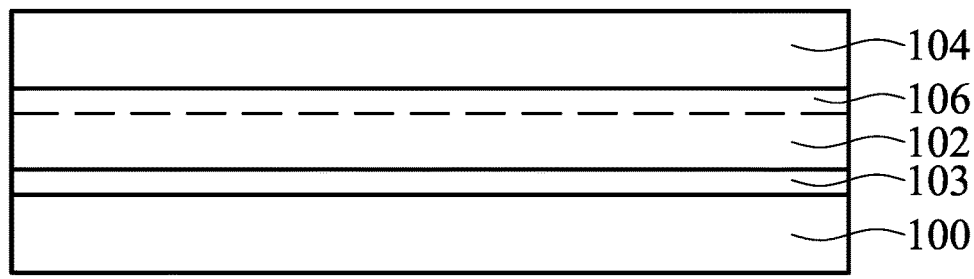

Next, referring to FIG. 3, a barrier layer 104 is formed on the channel layer 102. The material of the barrier layer 104 is different from the material of the channel layer 102. In some embodiments, the barrier layer 104 may include a III-V semiconductor, such as $Al_xGa_{1-x}N$, where 0<x<1. In other embodiments, the barrier layer 104 may also include GaN, AlN, GaAs, GaInP, AlGaAs, InP, InAlAs, InGaAs, other suitable III-V semiconductor materials, or combinations thereof. The thickness of the barrier layer 104 may range from about 5 nm to about 50 nm. The barrier layer 104 may be formed using molecular beam epitaxy (MBE), metalorganic chemical vapor deposition (MOCVD), hydride vapor phase epitaxy (HVPE), other suitable methods, or combinations thereof.

Since the material of the channel layer 102 is different from the material of the barrier layer 104, and the bandgaps of the channel layer 102 and the barrier layer 104 are different as well, a heterojunction is formed at the interface between the channel layer 102 and the barrier layer 104. The band bends at the heterojunction, and a quantum well is formed at the deep where the conduction band bends. The electrons produced by piezoelectricity are confined in the quantum well. Therefore, two-dimensional electron gas (2DEG) is formed at the interface between the channel layer 102 and the barrier layer 104, and a conducting current is generated. As shown in FIG. 3, a channel region 106 is formed at the interface between the channel layer 102 and the barrier layer 104. The channel region 106 is where the conducting current is generated by the two-dimensional electron gas (2DEG).

Figure 4:
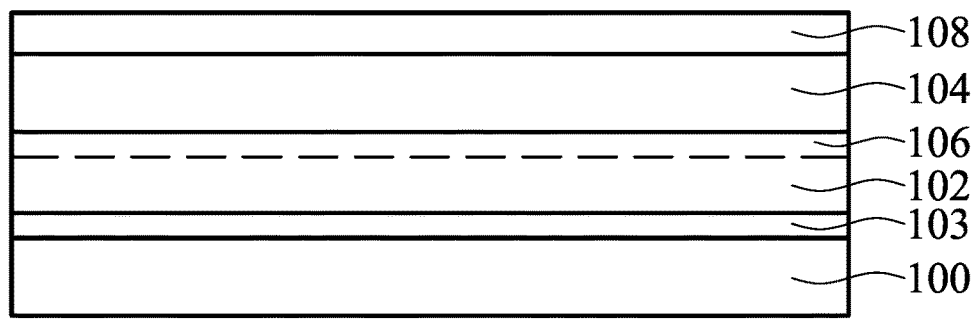

Next, referring to FIGS. 4-10A, a stack of layers is formed on the barrier layer 104. The stack of layers includes a doped compound semiconductor layer 108, an un-doped first capping layer 110 and a gate structure 118 that are subsequently formed. Firstly, as shown in FIG. 4, the doped compound semiconductor layer 108 is formed on the barrier layer 104. In some embodiments, the doped compound semiconductor layer 108 may include a p-type doped III-V semiconductor, such as GaN, AlGaN, AlN, GaAs, AlGaAs, InP, InAlAs, or InGaAs. In some other embodiments, the doped compound semiconductor layer 108 may include a II-VI semiconductor, such as CdS, CdTe, or ZnS. In some embodiments, the doped compound semiconductor layer 108 may be doped using Mg, Zn, Ca, Be, Sr, Ba, Ra, C, Ag, Au, Li, or Na so that the doped compound semiconductor layer 108 is p-type doped. The p-type dopant concentration may range from about $1\times10^{15}$ atoms/cm$^3$ to about $1\times10^{25}$ atoms/cm$^3$.

Figure 5:
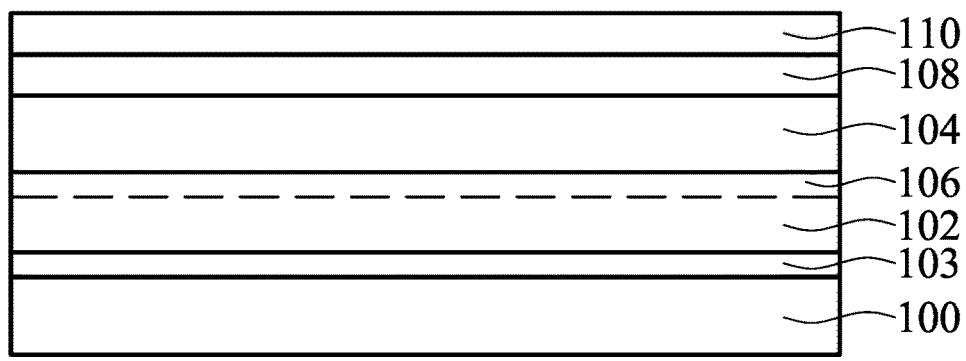

Next, as shown in FIG. 5, the un-doped first capping layer 110 is formed on the doped compound semiconductor layer 108. Although the un-doped first capping layer 110 may be referred to herein as the "un-doped" first capping layer, it is understood that a minimum or baseline level of dopants are present due to unavoidable introduction of some foreign material during the otherwise intrinsic epitaxial process. As a general matter, the un-doped first capping layer 110 has a dopant concentration of less than $5 \times 10^{17}$ atoms/cm$^3$. However, it is desired to maintain the un-doped first capping layer 110 in an un-doped state. In an embodiment, the "un-doped" first capping layer 110 refers to the first capping layer 110 that is not implanted with other elements, such as a III-V semiconductor, by diffusion and ion implantation.

During the subsequent processes for forming the gate structure and the source/drain structures, a high-temperature condition and high-energy plasma power are generally required. However, in such processes with high temperature and high energy, bonding of the doped compound semiconductor near the surface of the doped compound semiconductor layer 108 are prone to be damaged, and charge traps are thus generated, which may affect the performance of the resulting semiconductor device. Therefore, by disposing the un-doped first capping layer 110 on the doped compound semiconductor layer 108, the doped compound semiconductor layer 108 may be protected from damage due to the high temperature and the high energy of the subsequent processes. Device uniformity and hysteresis of the semiconductor device may be improved. Accordingly, the semiconductor device may provide higher saturation current.

In some embodiments, the un-doped first capping layer 110 includes a silicon-containing material. In the embodiments where the un-doped first capping layer 110 includes a silicon-containing material, the silicon-containing material may be a silicon-containing semiconductor material, such as C or SiC, that may be single crystalline, polycrystalline or amorphous, and in a preferred embodiment, the silicon-containing material may be low temperature poly-silicon. In some other embodiments, the silicon-containing material may also include silicon oxide, silicon carbide, silicon nitride, silicon oxynitride, silicon carbon nitride, silicon carbon oxide, silicon carbon oxynitride, metal silicide, or combinations thereof.

During the p-type doping process for forming the doped compound semiconductor layer 108, since the activation rate of dopants following doping is low, non-activated dopants may generate some charge traps in the doped compound semiconductor layer 108, and the performance of the resulting semiconductor device may thus be affected. Accordingly, if the un-doped first capping layer 110 includes a silicon-containing semiconductor material, the un-doped first capping layer 110 can protect the underlying doped compound semiconductor layer 108 from damage due to the high temperature and the high energy of the subsequent processes. In addition, the silicon-containing semiconductor material may compensate with the non-activated dopants, thereby improving device uniformity and hysteresis of the semiconductor device. The semiconductor device may also provide higher saturation current. Furthermore, compared to the p-type doping of the doped compound semiconductor layer 108, the silicon-containing semiconductor material in the un-doped first capping layer 110 is an n-type semiconductor material. Therefore, the un-doped first capping layer 110 may form an NP junction with the doped compound semiconductor layer 108. When the semiconductor device is in an on-state, this NP junction becomes a reverse bias, which may reduce the gate leakage of the semiconductor device and also increase the breakdown voltage of the gate.

In some embodiments, the thickness of the un-doped first capping layer 110 may range from about 1 nm to about 100 nm. The un-doped capping layer 110 may be formed using a chemical vapor deposition (CVD) process, a physical vapor deposition (PVD) process, any other suitable methods, or combinations thereof. For example, the chemical vapor deposition process may include a low-pressure CVD (LPCVD) process, a low-temperature CVD (LTCVD) process, a rapid thermal CVD (RTCVD) process, a plasma enhanced CVD (PECVD) process, or an atomic layer deposition (ALD) process. For example, the physical vapor deposition process may include a sputtering process, an evaporation process or a pulsed laser deposition (PLD) process.

Figure 6:
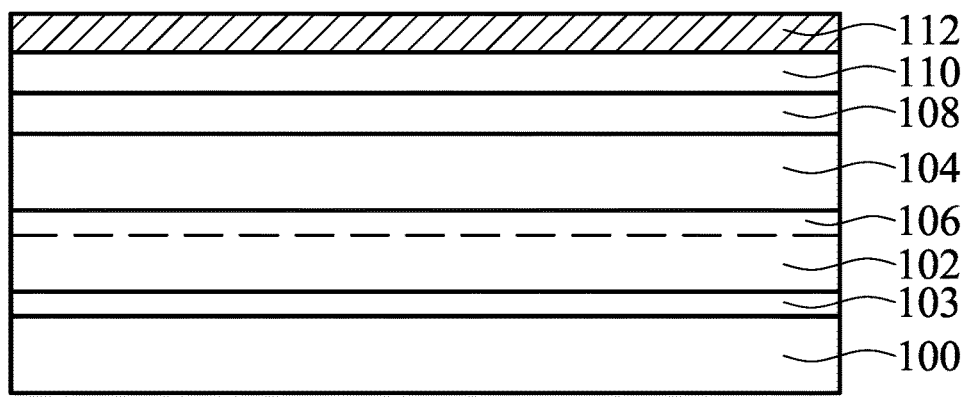

Next, as shown in FIG. 6, a gate auxiliary layer 112 is formed on the un-doped first capping layer 110. In some embodiments, the material of the gate auxiliary layer 112 may be a conductive material, such as metal, metal nitride, a semiconductor material or other suitable conductive materials. For example, metal may be Au, Ni, Pt, Pd, Ir, Ti, Cr, W, Al, Cu, or the like, or combinations thereof. The semiconductor material may be poly-silicon or poly-germanium. The gate auxiliary layer 112 may be formed using a chemical vapor deposition process, a physical vapor deposition process, any other suitable methods, or combinations thereof. For example, the chemical vapor deposition process may include a low-pressure CVD process, a low-temperature CVD process, a rapid thermal CVD process, a plasma enhanced CVD process, or an atomic layer deposition process. For example, the physical vapor deposition process may include a sputtering process, or an evaporation process or a pulsed laser deposition process.

Figure 7:
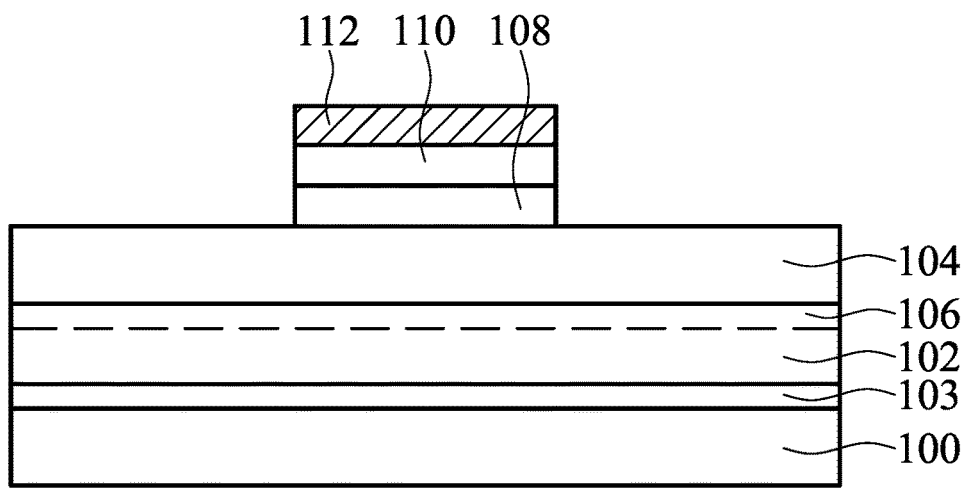

Next, referring to FIG. 7, the doped compound semiconductor layer 108, the un-doped first capping layer 110 and the auxiliary layer 112 are patterned to expose a portion of the barrier layer 104. The patterning process includes photolithography processes and etching processes. In some embodiments, the photolithography process may include photoresist coating, soft baking, hard baking, mask aligning, exposure, post-exposure baking, developing the photoresist, rinsing, drying, or other suitable processes. In some embodiments, the etching process may include a dry etching process, a wet etching process, or combinations thereof. For example, the dry etching process may include a reactive ion etch (RIE) process, a plasma etch process and so on.

Figure 8:
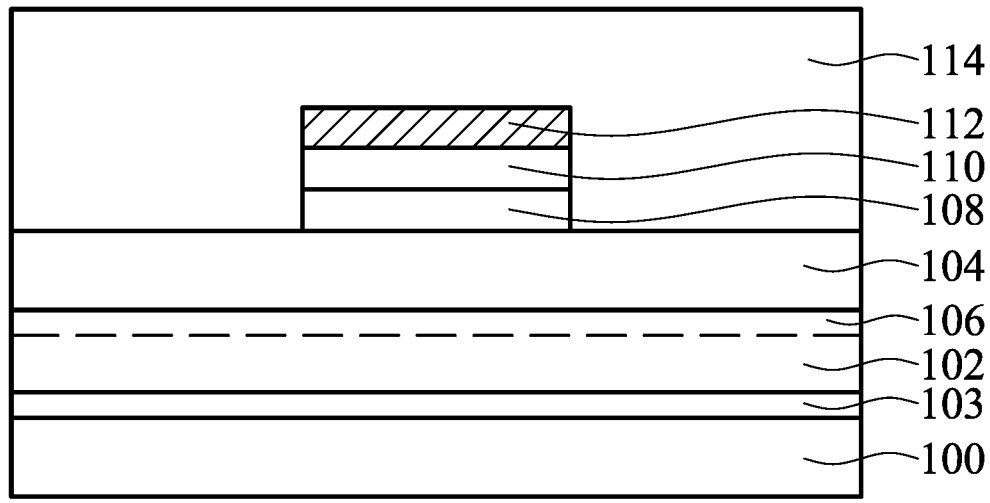

Following patterning the above layers, as shown in FIG. 8, a passivation layer 114 is formed on the exposed barrier layer 104 covering the doped compound semiconductor layer 108, the un-doped first capping layer 110 and the gate auxiliary layer 112 that are patterned. In some embodiments, the passivation layer 114 may include silicon dioxide, silicon nitride, silicon oxynitride, aluminum oxide, aluminum nitride, fluorinated silica glass (FSG), hydrogen silsesquioxane (HSQ), carbon-doped silicon oxide, fluorinated carbon, parylene, polyimide (PI), benzocyclobutene (BCB), polybenzoxazole (PBO), other insulating materials, or combinations thereof. The passivation layer 114 may be formed using a chemical vapor deposition process, a physical vapor deposition process, an atomic layer deposition process, other suitable processes, or combinations thereof.

For example, in some embodiments, the passivation layer 114 may be formed blanketly on the barrier layer 104, the doped compound semiconductor layer 108, the un-doped first capping layer 110 and the gate auxiliary layer 112. Subsequently, suitable planarization processes may be performed to remove excess materials of the passivation layer 114 so that the passivation layer 114 has a flat upper surface. In some embodiments, the planarization process may include a chemical mechanical polishing (CMP) process, a grinding process, an etching process, or combinations thereof.

Figure 9:
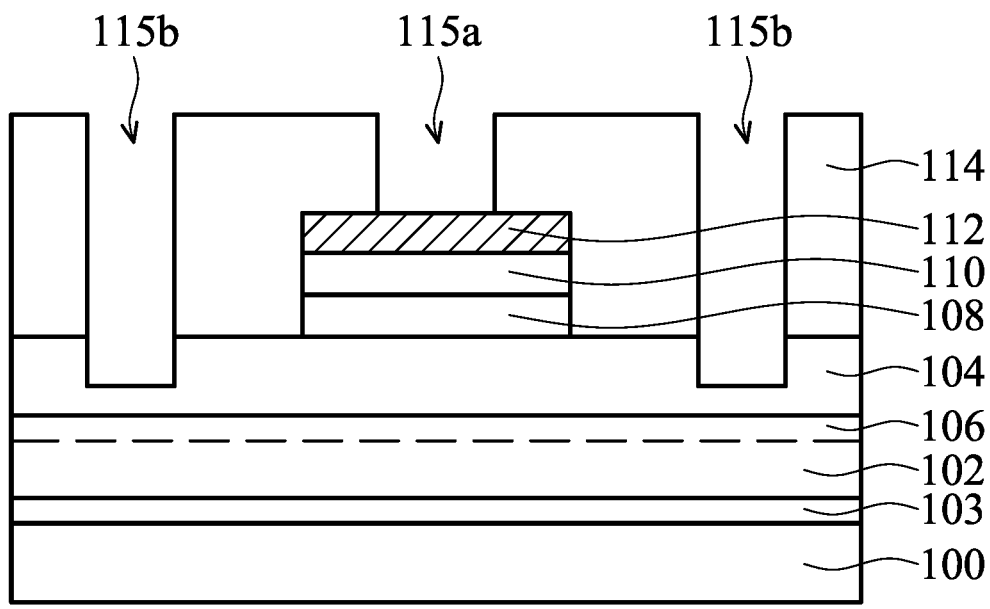
Figure 10A:
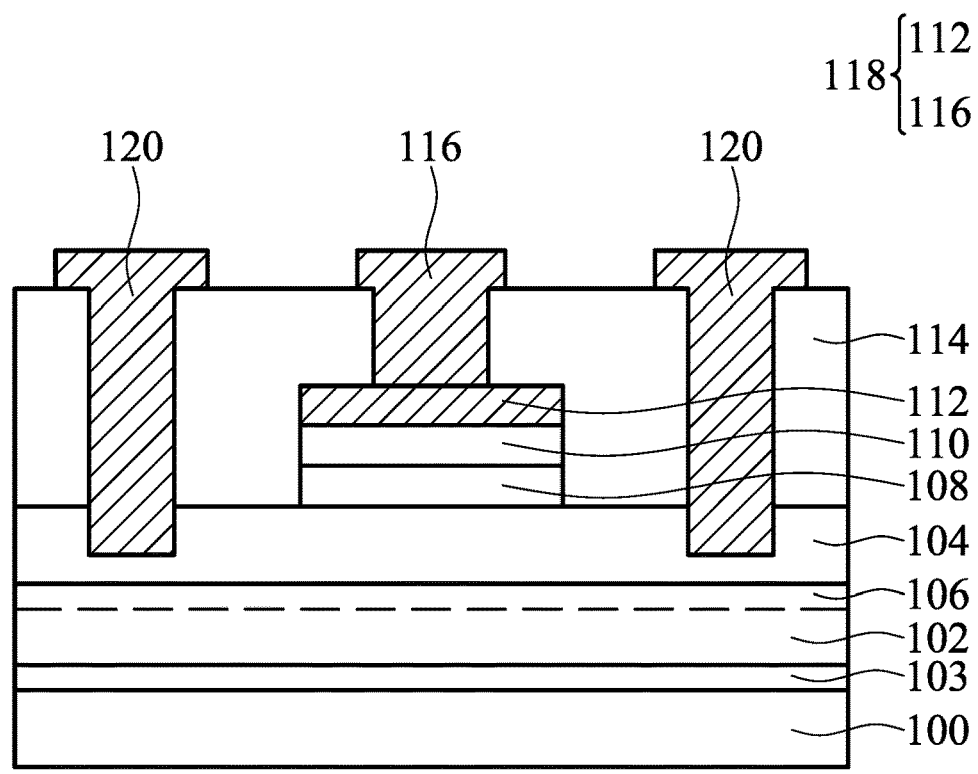
FIG. 10A is a cross-sectional view of various stages in the formation of a semiconductor device in accordance with some embodiments of the disclosure.

Next, as shown in FIG. 9, an opening 115a exposing the gate auxiliary layer 112 and openings 115b exposing the barrier layer 104 are formed in the passivation layer 114 using patterning processes. The openings 115b are on opposite sides of the opening 115a. The openings 115a and 115b are used for the gate and the source/drain structures that are subsequently formed. Referring to FIG. 10A, a gate 116 is formed in the opening 115a puncturing through the passivation layer 114 and directly contacting the gate auxiliary layer 112, and source/drain structures 120 is formed in the openings 115b puncturing through the passivation layer 114 and directly contacting the barrier layer 104. In some embodiments, the gateauxiliary layer 112 and the source/drain structures 120 may be formed in the same process, but the present disclosure is not limited thereto. In other embodiments, the gateauxiliary layer 112 and the source/drain structures 120 may also be formed in different processes.

In some embodiments, the gate 116 may include a conductive material, such as Al, Cu, W, Ti, Ta, TiN, TaN, NiSi, CoSi, TaC, TaSiN, TaCN, TiAlN, metal oxide, an metal alloy, other suitable conductive materials, or combinations thereof. The gate 116 and the aforementioned gate auxiliary layer 112 are referred to as a gate structure 118 as illustrated in FIG. 10A. The material and the forming process for the source/drain structures 120 and the gate auxiliary layer 112 may be the same or similar, which is not repeated herein.

As shown in FIG. 10A, the semiconductor device of the embodiments of the present disclosure includes the substrate 100, the buffer layer 103 on the substrate 100, the channel layer 102 on the buffer layer 103, the barrier layer 104 on the channel layer 102, the doped compound semiconductor layer 108 on a portion of the barrier layer 104, the un-doped first capping layer 110 on the doped compound semiconductor layer 108, the passivation layer 114 on the barrier layer 104, the gate structure 118 on the un-doped first capping layer 110, and the source/drain structures 120 on opposite sides of the gate structure 118 puncturing through the passivation layer 114 and directly contacting the barrier layer 104. In addition, the semiconductor device further includes the channel region 106 that is in the channel layer 102 and is adjacent to interface between the channel layer 102 and the barrier layer 104. In these embodiments, the gate structure 118 includes the gate auxiliary layer 112 on the un-doped first capping layer 110 and the gate 116 on the gate auxiliary layer 112.

In the embodiments as illustrated in FIGS. 1-9 and 10A, by inserting an un-doped capping layer between the gate structure and the underlying doped compound semiconductor layer, the doped compound semiconductor layer may be protected from damage due to the high temperature and the high energy of the subsequent processes. Accordingly, charge traps may not be generated. In addition, in the above embodiments, the un-doped first capping layer includes a silicon-containing semiconductor material, which may not only protect the underlying doped compound semiconductor layer but also compensate with the non-activated dopants in the doped compound semiconductor layer. As evidence by experimentation, by disposing a capping layer that has a silicon-containing semiconductor material on the doped compound semiconductor layer, device uniformity of the semiconductor device may be increased by about 2 to about 5 folds, hysteresis of the semiconductor device may be decreased by about 10 folds, and the semiconductor device may provide saturation current that is more than 2 folds. Furthermore, compared to the doped compound semiconductor layer, the silicon-containing semiconductor material is an n-type semiconductor so that the un-doped first capping layer may form an NP junction with the doped compound semiconductor layer. When the semiconductor device is in an on-state, this NP junction becomes a reverse bias, which may reduce the gate leakage of the semiconductor device and also increase the breakdown voltage of the gate.

Figure 10B:
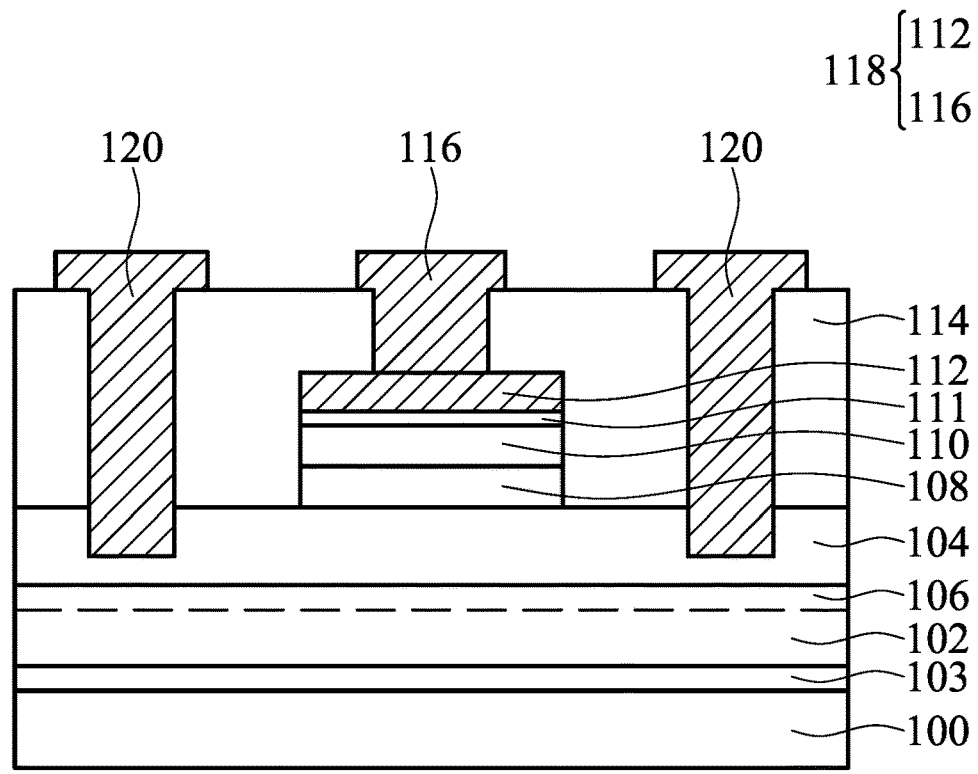
FIG. 10B is a cross-sectional view of a semiconductor device in accordance with other embodiments of the disclosure.

FIG. 10B is a cross-sectional view of a semiconductor device in accordance with other embodiments of the disclosure. In these embodiments, the stack of layers formed by the doped compound semiconductor layer 108, the un-doped first capping layer 110 and the gate structure 118 further includes a second capping layer 111 between the un-doped first capping layer 110 and the gate structure 118. More specifically, the un-doped first capping layer 110 is formed on the doped compound semiconductor layer 108 first, and the second capping layer 111 is formed on the un-doped first capping layer 110. In preferred embodiments, the doped compound semiconductor layer 108, the un-doped first capping layer 110 and the second capping layer 111 may be patterned in the meantime so that the projected areas of the doped compound semiconductor layer 108, the un-doped first capping layer 110 and the second capping layer 111 are the same. Compared to the un-doped first capping layer 110, the second capping layer 111 may not only provide further protection to the doped compound semiconductor layer 108 but also compensate electron traps or hole traps generated by the subsequent processes, thereby forming a reverse diode at the interface between the un-doped first capping layer 110 and the doped compound semiconductor layer 108. Therefore, the gate leakage of the semiconductor device may be reduced, and the breakdown voltage of the gate may be increased.

In some embodiments, the second capping layer 111 is made of a different material than the un-doped first capping layer 110. For example, according to some embodiments of the disclosure, the material of the second capping layer 111 includes aluminum oxide, aluminum nitride, or a combination thereof. The second capping layer 111 may be formed using a chemical vapor deposition process, a physical vapor deposition process, any other suitable methods, or combinations thereof. In some embodiments, the thickness of the second capping 111 ranges from about 1 nm to about 100 nm.

As stated above, the embodiments of the present disclosure provide a semiconductor device. By inserting an un-doped capping layer between the gate structure and the underlying doped compound semiconductor layer, the doped compound semiconductor layer may be protected from damage due to the high temperature and the high energy of the subsequent processes during the processes with high temperature and high energy. Device uniformity and hysteresis of the semiconductor device may be improved, and the semiconductor device may provide higher saturation current. In addition, the silicon-containing semiconductor material in the capping layer may not only compensate charge traps in the doped compound semiconductor layer but also cause the capping layer and the doped compound semiconductor layer to form an NP junction, thereby reducing the gate leakage of the semiconductor device and increasing the breakdown voltage of the gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a buffer layer on the substrate;
a channel layer on the buffer layer;
a barrier layer on the channel layer, wherein a channel region is in the channel layer and is adjacent to an interface between the channel layer and the barrier layer;
a patterned p-doped compound semiconductor layer on a portion of the barrier layer;
a patterned un-doped first capping layer on the patterned p-doped compound semiconductor layer and in direct contact with the patterned p-doped compound semiconductor layer, wherein the patterned un-doped first capping layer comprises poly-silicon;
a gate structure on the patterned un-doped first capping layer; and
source/drain structures on opposite sides of the gate structure, wherein the patterned p-doped compound semiconductor layer and the patterned un-doped first capping layer are not in direct contact with the source/drain structures.

2. The semiconductor device of claim 1, wherein the gate structure further comprises a gate auxiliary layer on the patterned un-doped first capping layer and a gate on the gate auxiliary layer.

3. The semiconductor device of claim 1, further comprising a passivation layer on the barrier layer, wherein the source/drain structures penetrate the passivation layer and is in direct contact with the barrier layer.

4. The semiconductor device of claim 1, wherein a thickness of the patterned un-doped first capping layer is in a range between 1 nm and 100 nm.

5. The semiconductor device of claim 1, further comprising a second capping layer between the patterned un-doped first capping layer and the gate structure, wherein the second capping layer is formed of a different material than a material of the patterned un-doped first capping layer.

6. The semiconductor device of claim 5, wherein the material of the second capping layer comprises aluminum oxide or aluminum nitride.

7. The semiconductor device of claim 5, wherein a thickness of the second capping layer is in a range between 1 nm and 100 nm.

8. The semiconductor device of claim 1, wherein the gate structure is in direct contact with the patterned un-doped first capping layer.

9. The semiconductor device of claim 1, wherein a p-type dopant concentration of the patterned p-doped compound semiconductor layer is between $1 \times 10^{15}$ atoms/cm$^3$ to $1 \times 10^{25}$ atoms/cm$^3$.

10. The semiconductor device of claim 1, wherein a dopant concentration of the un-doped first capping layer is less than $5 \times 10^{17}$ atoms/cm$^3$.

11. A method for forming a semiconductor device, comprising:
forming a buffer layer on a substrate;
forming a channel layer on the buffer layer;
forming a barrier layer on the channel layer, wherein a channel region is in the channel layer and is adjacent to an interface between the channel layer and the barrier layer;
forming a stack of layers on a portion of the barrier layer sequentially comprising, from bottom to top, a patterned p-doped compound semiconductor layer, a patterned un-doped first capping layer and a gate structure, wherein the patterned un-doped first capping layer comprises poly-silicon and is in direct contact with the patterned p-doped compound semiconductor layer; and
forming source/drain structures on opposite sides of the gate structure, wherein the patterned p-doped compound semiconductor layer and the patterned un-doped first capping layer are not in direct contact with the source/drain structures.

12. The method of claim 11, wherein the gate structure further comprises a gate auxiliary layer on the patterned un-doped first capping layer and a gate on the gate auxiliary layer.

13. The method of claim 11, further comprising forming a passivation layer on the barrier layer, wherein the source/drain structures penetrate the passivation layer and is in direct contact with the barrier layer.

14. The method of claim 11, wherein the stack of layers further comprises a second capping layer between the patterned un-doped first capping layer and the gate structure, and the second capping layer is formed of a different material than the material of the patterned un-doped first capping layer.

15. The method of claim 14, wherein the material of the second capping layer comprises aluminum oxide or aluminum nitride.

* * * * *